(12) United States Patent
Klehr et al.

(10) Patent No.: US 10,060,768 B2
(45) Date of Patent: Aug. 28, 2018

(54) PASSIVE HEAT DISSIPATION FOR MULTI-STAGE SENSOR PROCESSING

(71) Applicant: Siemens Aktiengesellschaft, Munich (DE)

(72) Inventors: Stefan Klehr, Rheinzabern (DE); Herbert Schorb, Karlsruhe (DE); Stefan von Dosky, Karlsruhe (DE)

(73) Assignee: Siemens Aktiengesellschaft, Munich (DE)

( * ) Notice: Subject to any disclaimer, the term of this patent is extended or adjusted under 35 U.S.C. 154(b) by 155 days.

(21) Appl. No.: 14/361,974

(22) PCT Filed: Dec. 5, 2012

(86) PCT No.: PCT/EP2012/074428
§ 371 (c)(1),
(2) Date: May 30, 2014

(87) PCT Pub. No.: WO2013/083598
PCT Pub. Date: Jun. 13, 2013

(65) Prior Publication Data
US 2014/0338473 A1   Nov. 20, 2014

(30) Foreign Application Priority Data

Dec. 8, 2011 (DE) .................. 10 2011 088 053

(51) Int. Cl.
*G01D 7/00* (2006.01)
*H05K 7/14* (2006.01)
(Continued)

(52) U.S. Cl.
CPC ................ *G01D 7/00* (2013.01); *G01D 1/00* (2013.01); *H05K 7/1462* (2013.01); *H05K 7/20336* (2013.01)

(58) Field of Classification Search
CPC .......... G01D 7/00; G01D 1/00; H05K 7/1462; H05K 7/20336
(Continued)

(56) References Cited

U.S. PATENT DOCUMENTS 4,169,387 A    10/1979   Krempl
4,485,670 A *  12/1984   Camarda ............. F28D 15/0233
                                                 165/104.26
(Continued)

FOREIGN PATENT DOCUMENTS

AT           353036 B        10/1979
CN          101242726         8/2008
(Continued)

OTHER PUBLICATIONS

Translation of WO 2008123313 A1.*

*Primary Examiner* — Natalie Huls
*Assistant Examiner* — Monica S Young
(74) *Attorney, Agent, or Firm* — Cozen O'Connor

(57) ABSTRACT

A measurement transducer having a sensor for converting a physical or chemical variable into an electrical signal which can be further processed, and an electronics unit proximate the sensor, for pre-processing the electrical signal and generating a measurement signal, wherein an evaluation device is connected to the receiver by an interface for transmitting the measurement signal and serves to determine a measurement value as a function of the measurement signal and output the measurement value, and so that the sensor can be operated at a relatively high temperature and the electronics unit arranged proximate the sensor, for reducing measurement noise is operable at a relatively low temperature, the electronics unit proximate the sensor, is provided with a thermal insulation with respect to the sensor and is cooled by a heat pipe, and where the evaluation device housing
(Continued)

approximately at ambient temperature preferably serves as a heat sink.

3 Claims, 1 Drawing Sheet

(51) Int. Cl.
  *H05K 7/20* (2006.01)
  *G01D 1/00* (2006.01)
(58) Field of Classification Search
  USPC ........................................................ 73/865.8
  See application file for complete search history.

(56) References Cited

U.S. PATENT DOCUMENTS

| | | | | |
|---|---|---|---|---|
| 4,906,105 | A * | 3/1990 | Geake | G01J 5/12 |
| | | | | 374/121 |
| 5,935,502 | A * | 8/1999 | Ferri | B29C 45/14655 |
| | | | | 257/E21.504 |
| 6,510,740 | B1 * | 1/2003 | Behm | G01D 1/00 |
| | | | | 73/708 |
| 7,430,917 | B2 * | 10/2008 | Hedtke | G01L 19/0007 |
| | | | | 73/706 |
| 2002/0108448 | A1 * | 8/2002 | Behm | G01D 1/00 |
| | | | | 73/753 |
| 2005/0126296 | A1 | 6/2005 | Hedtke | |
| 2005/0217889 | A1 * | 10/2005 | Nelson | H01R 4/029 |
| | | | | 174/94 R |
| 2005/0225035 | A1 | 10/2005 | Sundet | |
| 2007/0272027 | A1 * | 11/2007 | Hedtke | G01L 19/0007 |
| | | | | 73/756 |
| 2009/0183575 | A1 | 7/2009 | Matzen | |
| 2009/0314093 | A1 | 12/2009 | Hausler | |
| 2009/0314096 | A1 * | 12/2009 | Colombo | G01L 19/0084 |
| | | | | 73/754 |
| 2011/0038120 | A1 * | 2/2011 | Merz | G02F 1/133308 |
| | | | | 361/679.47 |
| 2011/0073293 | A1 * | 3/2011 | Gauthier | B06B 1/0618 |
| | | | | 165/185 |
| 2011/0188279 | A1 * | 8/2011 | Aiba | H05K 7/20 |
| | | | | 363/141 |
| 2012/0043652 | A1 * | 2/2012 | Ushijima | H01L 23/427 |
| | | | | 257/717 |
| 2012/0229225 | A1 * | 9/2012 | Horie | H02N 2/001 |
| | | | | 331/158 |
| 2013/0074604 | A1 * | 3/2013 | Hedtke | G01L 19/0061 |
| | | | | 73/753 |
| 2013/0247647 | A1 * | 9/2013 | Mahoney | G01N 33/2841 |
| | | | | 73/19.11 |
| 2014/0369377 | A1 * | 12/2014 | Sakami | G01N 25/64 |
| | | | | 374/28 |
| 2016/0036298 | A1 * | 2/2016 | Yamamoto | H02K 9/22 |
| | | | | 310/52 |

FOREIGN PATENT DOCUMENTS

| | | |
|---|---|---|
| DE | 138837 A1 | 11/1979 |
| DE | 3722518 C1 | 1/1989 |
| DE | 102004060647 A1 | 10/2005 |
| DE | 102005012437 A1 | 10/2005 |
| DE | 102006024742 A1 | 12/2007 |
| DE | 102004060647 B4 | 3/2009 |
| JP | WO 2008123313 A1 * 10/2008 ............. G01N 25/64 |

* cited by examiner

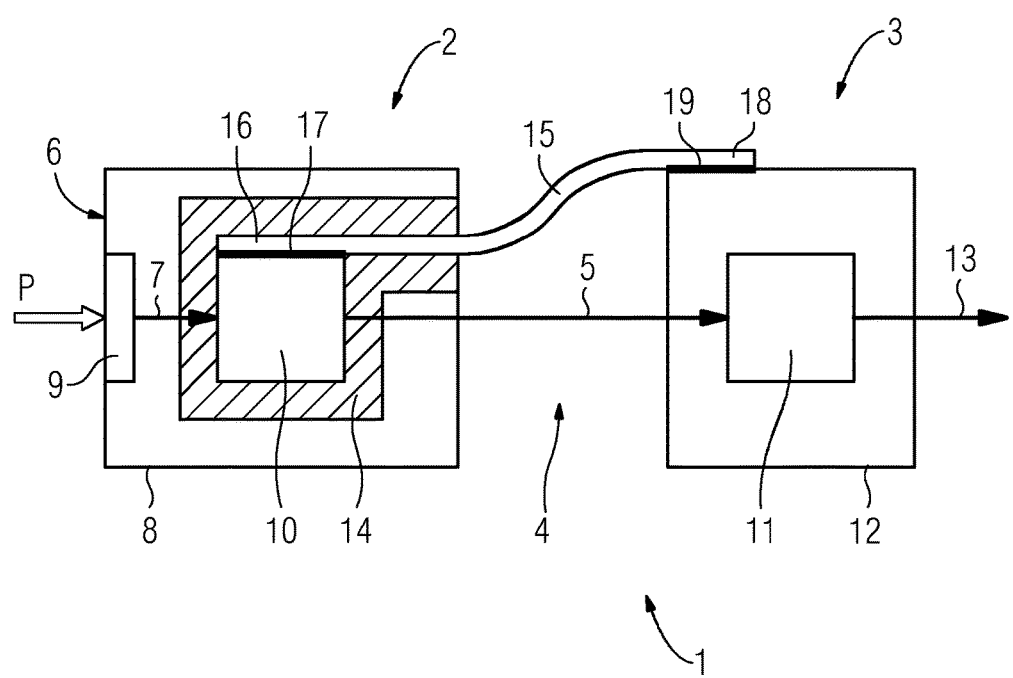

PASSIVE HEAT DISSIPATION FOR MULTI-STAGE SENSOR PROCESSING

REFERENCE TO RELATED APPLICATIONS

This is a U.S. national stage of application No. PCT/EP2012/074428 filed 5 Dec. 2012. Priority is claimed on German Application No. 10 2011 088 053.4 filed 8 Dec. 2011, the content of which is incorporated herein by reference in its entirety.

BACKGROUND OF THE INVENTION

1. Field of the Invention

The invention relates to a measurement transducer and, more particularly, to a measurement transducer having a high level of accuracy across a wide temperature range.

2. Description of the Related Art

Field devices for process instrumentation that are used to record and/or influence process variables, for example, and are connected to one another via an automation network, i.e., with a field bus, for the purpose of interchanging data are often used in automation technology. Field devices that record a physical or chemical variable as a process variable are often referred to as measurement transducers because they convert the respective variable into a measured value and output this value to a superordinate control station, for example, or, as an actual value, to a regulator for further processing. Examples that may be mentioned are measurement transducers for temperature, pressure, flow rate, flow velocity, filling level, density, pH, conductivity or gas concentration of a medium.

DE 10 2006 024 742 A1 discloses a modular measurement transducer for magnetoinductive flow measurement. This transducer comprises a pick-up for recording the flow velocity of a medium flowing through a measuring tube and for generating a corresponding measurement signal. Analog components for recording the physical variable and for converting this variable into an electrical signal which can be processed further, as well as electronic components for generating a digital measurement signal, are combined in a pick-up housing. Signal preprocessing therefore occurs in an electronic unit close to the sensor and there is no need to transmit analog signals over relatively long connecting lines. The sensitivity of the measurement transducer to external interference, which could distort analog signals, is therefore comparatively low and good measurement accuracy is achieved. An evaluation device that is accommodated in a housing separate from the pick-up housing is used to further evaluate the measurement signal, such as to linearize the measurement signal, so as to perform monitoring and diagnostic functions and to transmit measured values. Based on the measurement signal, the evaluation device therefore calculates a measured value for the flow velocity and outputs the measured value to a superordinate control station or a flow rate regulator, for example, via the communication interface for further processing. The pick-up and the evaluation unit are often also referred to as a sensor and a transmitter, in which case, in a manner deviating therefrom, the term "sensor" in connection with this application is intended to be understood as meaning only the component that is used to convert the physical or chemical variable into an electrical signal which can be processed further.

Process instrumentation field devices are often approved for use in an ambient temperature range of −40 to +85° C., this including the complete device with the pick-up and the evaluation device. In addition, there are measurement transducers in which only the pick-up is approved for an extended temperature range. For example, pick-ups for pressure measurement transducers, which have a pressure measurement cell filled with oil as the pressure transfer medium, are often approved for a range of use of up to +100° C. This limit is justified, on the one hand, by the quality of the silicone oil in which undesirable bubbles may be produced by degassing previously dissolved gases at relatively high temperatures and, on the other hand, by the sensor used and its electronics close to the sensor.

However, in certain applications, the temperature of the process medium is so high that mounting of a pressure sensor, for example, in the direct vicinity of the process medium would destroy the sensor or would at least reduce the measurement accuracy. In order to nevertheless enable a measurement, DE 10 2004 060 647 B4, for example, discloses the use of a pressure transmitter between the process connection and the sensor. A long capillary tube that is filled with a high-quality fluid as the pressure transfer medium and spatially separates the pressure measuring point with the hot process medium from the pick-up is situated between the process connection, which is referred to as a remote process sealing unit there, and the sensor. The pressure is therefore transferred over a relatively long distance using the incompressible fluid. However, the disadvantage is still possible inaccuracy on account of undesirable bubble formation in the fluid and certain distortion of the measured pressure value that may be produced on account of the remaining, variable compressibility caused by sorbed gas inclusions, for example, mass inertia and the viscosity of the filling fluid. In addition, the use of such a pressure transmitter is associated with a considerable amount of additional effort.

SUMMARY OF THE INVENTION

It is an object of the invention to provide a measurement transducer that has a high level of accuracy across a wide temperature range.

This and other objects and advantages are achieved in accordance with the invention by providing a measurement transducer in which at high temperatures of a process medium at which a physical or chemical variable is intended to be recorded, the measurement transducer has the advantage that the sensor and the electronic unit close to the sensor are thermally separated from one another and are therefore not exposed to the same high temperature load. Here, close coupling of the sensor to the process medium is still possible, with the result that distortion of the variable on the transmission path from the medium to the sensor can be largely avoided. For example, during a temperature measurement using thermal contact, sufficient thermal conduction and the vicinity of the sensor to the process medium are of fundamental importance. However, even when measuring other physical or chemical variables, such as during the pressure measurement explained above, a short transmission path considerably contributes to improving the accuracy. Pressure sensors which, due to their design, can withstand substantially higher process temperatures, such as 200° C. or more, are available. These are implemented, for example, using silicon-on-insulator (SOI) technology or in a ceramic-based manner. These sometimes manage without an oil-filled measurement cell, with the result that the pressure to be measured directly acts on the high-temperature pressure measurement cell.

On account of its thermal insulation with respect to the sensor, the electronic unit of the pick-up that is close to the sensor can be arranged comparatively close to the sensor. An electrical signal that is generated by the sensor and can be processed further therefore advantageously need not be transmitted over a relatively long distance to the electronic unit which preprocesses the electrical signal. On account of the lines between the sensor and the electronic unit close to the sensor which are therefore short, radiated interference, for example, on account of parasitic capacitances or stray inductances, and therefore noise in the electrical signal are reduced.

The electronic unit that is close to the sensor and usually also contains sensitive analog circuits is advantageously cooled in a particularly effective manner via a heat pipe. In this case, the temperature of the electronic unit close to the sensor is substantially dependent on the ambient temperature that is usually considerably lower than the temperature of the process medium. This is advantageous even with only a moderately increased temperature of the sensor because a lower temperature of the electronic unit used for signal preprocessing fundamentally has an advantageous effect on reducing the measurement noise. The use of a heat pipe to cool the electronic unit close to the sensor has the advantage in this case that it is a passive heat transport system in which the heat transport is driven only by the temperature difference between the heat source and the heat sink and that the installation position of the heat pipe, in which the heat of evaporation of a substance is used for cooling, has virtually no influence on the thermal power that can be transferred given the correct design of the heat pipe. The use of a suitable heat pipe is advantageously associated with a comparatively small amount of additional effort.

In principle, it is possible to use, as the heat sink, a separate heat sink that emits the heat dissipated by the electronic unit close to the sensor to the ambient air. However, the expenditure for the additional heat sink can be advantageously dispensed with if the heat sink is formed by the housing of the evaluation device. This is because, with comparatively little thermal coupling between the housing of the pick-up and the housing of the evaluation device, the housing of the evaluation device is not exposed to the high temperature of the process medium but rather only to the ambient temperature that is usually considerably lower. Both the electronic unit close to the sensor in the pick-up and the electronics of the measurement transducer that are in the evaluation device are therefore kept at the comparatively low temperature level of the environment, thus making it possible to ensure permanent and reliable operation of the measurement transducer with good accuracy.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF DRAWING

The invention and refinements and advantages are explained in more detail below using the drawing which illustrates an exemplary embodiment of the invention, in which:

The FIGURE shows a schematic block diagram of the measurement transducer in accordance with the invention.

DETAILED DESCRIPTION OF THE PREFERRED EMBODIMENTS

With reference to the FIGURE, a measurement transducer 1 has a modular structure and, in the exemplary embodiment shown, consists of a pick-up 2 and an evaluation device 3 that are connected to one another via an interface 4 for transmitting a measurement signal 5. A process connection 6 is used to place the pick-up 2 of the measurement transducer 1, during, its operation, onto a pipeline, for example, which carries a process medium at which a physical or chemical variable, such as a pressure P, is intended to be recorded. In order to convert the pressure P into an electrical signal 7 that can be processed further, a sensor 9 is provided inside a housing 8 of the pick-up 2. In order to achieve a high degree of measurement accuracy, this sensor is situated close to the process connection 6 and therefore in thermal contact with the process medium. This ensures that the physical or chemical variable, the pressure P in the exemplary embodiment shown, passes to the sensor 9 over a comparatively short distance and therefore with very little distortion. The electrical signal 7 that is sensitive to interference is likewise passed via a comparatively short connection to an electronic unit close to the sensor to largely avoid interference being coupled-in inside the housing 8 of the pick-up 2, which electronic unit is used to preprocess the electrical signal 7 and uses the latter to form the measurement signal 5 that is insensitive to interference. The electronic unit 10 may perform, for example, signal amplification, impedance conversion and/or digitization. The measurement signal 5 is supplied, on the one hand, to a second electronic unit 11 in a housing 12 of the evaluation device 3 via the interface 4. On the other hand, the interface 4 is used to transmit the energy needed to operate the pick-up 2 and possibly for further communication between the pick-up 2 and the evaluation device 3. Suitable further processing of the measurement signal 5 in the evaluation device 3 gives a measured value 13 that is transmitted to further automation components in an automation network, such as via a field bus.

The measurement transducer 1 is configured for use at high temperatures of a process medium, such as to 200° C. There is thermal coupling between the process medium and the sensor 9 via the process connection 6 and the direct coupling of the sensor 9 to the process medium. As a result, the sensor is likewise configured for use at such high temperatures. The comparatively high temperature of the process medium spreads virtually over the entire interior of the housing 8 of the pick-up 2, with the exception of the electronic unit 10 close to the sensor.

In order to operate the electronic unit 10 with low noise and in order to comply with the admissible operating temperature of the electronic unit 10, the electronic unit 10 is protected from inadmissible heating by thermal insulation 14 with respect to the housing 8 of the pick-up 2 and its interior. In a particularly advantageous manner, the thermal insulation therefore exists between the sensor 9 and the electronic unit 10 close to the sensor, as a result of which, on the one hand, the sensor and the electronic unit can also have different temperatures during operation and, on the other hand, the electrical signal 7 must be transmitted only over a comparatively short distance. The direct coupling of the sensor 9 to a process medium and the lower operating temperature of the electronic unit 10 close to the sensor, which are enabled thereby, both contribute to improving the accuracy of the measurement transducer 1.

A heat pipe 15 is used to cool the electronic unit 10 close to the sensor. There is thermal coupling 17 between one end 16 of the heat pipe 15 and the electronic unit 10 close to the sensor and there is thermal coupling 19 between the other end 18 of the heat pipe and the housing 12 of the evaluation device 3, which coupling can be achieved using a thermally conductive paste, for example. The heat produced in the electronic unit 10 close to the sensor and the thermal energy coupled in from the hotter environment in the interior of the pick-up 2 to the electronic unit 10 through the thermal insulation 14 are therefore effectively dissipated to the housing 12 of the evaluation device 3 through the heat pipe 15. The temperature of the housing 12 is approximately equal to the ambient temperature that is usually considerably below 85° C. in industrial applications. A correct design of the heat pipe ensures that the electronic unit 10 close to the sensor becomes only approximately 5 to 10 K warmer than the temperature of the housing 12, to be precise largely independently of the temperature of the process medium and of the sensor 9. This shall be explained below using a simplified calculation example for the design of the heat pipe:

It is assumed that, for a practical embodiment, the electronic unit 10 close to the sensor is formed as a populated printed circuit board that is accommodated in a cuboid with the edge lengths 40 mm, 25 mm and 5 mm. Both this cuboid and the heat pipe are embedded in an epoxy resin layer with a thickness of 2 mm as a thermal insulator 14. Air with an overtemperature of 150 K, for example, is outside this shell. The heat pipe 15 extends, together with the electronic unit 10 close to the sensor, over a length of 80 mm into the hot housing 8 of the pick-up 2. The surface area of the thermal insulator 14 calculated using these geometrical dimensions and the thermal conductivity of epoxy resin, which is assumed to be 0.2 W/(m K), produce a heat flow of 2.6 W through the thermal insulator 14. This thermal power can be dissipated without any problems using a small commercially available heat pipe of 15 W. If a heat pipe with capillaries, i.e., a capillary heat pipe, is used to transport the cooling medium, the installation position advantageously has no significant influence on the thermal power which can be transferred. Such heat pipes are available on the market in a comparatively favorable manner, with the result that the increase in the production outlay on account of the use of a heat pipe 15 is comparatively low in comparison with the improvement in the accuracy of the measurement transducer 1 achieved thereby.

The new construction principle of the measurement transducer 1 can advantageously be used in all types of measurement transducers confronted with high temperatures of the process media.

The advantages achieved by the new measurement transducer are thus the sensor 9 and the electronic unit 10 close to the sensor can be operated in a very hot environment. There is no fear of failure of the measurement electronics on account of overtemperature or a reduction in the measurement accuracy. There is no need for the structurally complicated, expensive and measurement error-prone solution using a pressure transmitter. The temperature of the electronics 10 close to the sensor is substantially dependent only on the temperature of the housing 12 of the evaluation device 3. A lower temperature of the electronic unit 10 close to the sensor results in less measured value noise during signal preprocessing. As a result, better measurement accuracy can also be achieved with only a moderately increased temperature of the pick-up 2. Lastly, heat pipe 15 enables a passive heat transport system in which the heat transport is driven only by the temperature gradient, and the structure/device for cooling the electronic unit 10 close to the sensor is free of maintenance and wear.

Thus, while there have been shown, described, and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A measurement transducer comprising:
a pick-up having a sensor for recording one of a physical variable and a chemical variable and for converting one of the physical variable and a chemical variable into an electrical signal which is processed further and having an electronic unit proximate to the sensor for preprocessing the electrical signal and for generating a measurement signal corresponding to a respective value of one of the physical variable and the chemical variable;
a thermal insulating layer which thermally insulates the electronic unit with respect to the sensor;
an evaluation device comprising a heat sink and operatively coupled to the pick-up via an interface for transmitting the measurement signal and being configured to determine a measured value based on the measurement signal and to output the determined measured value; and
a heat pipe providing a passive heat transport system in which the heat transport is driven only by a temperature gradient, said heat pipe thermally coupling the heat sink to the electronic unit arranged proximate to the sensor, the electronic unit and the heat pipe being embedded in the thermal insulating layer;
wherein the electronic unit is entirely embedded and surrounded within the thermal insulating layer and the heat pipe is partially embedded in the thermal insulating layer and extends beyond the insulating layer to connect to the heat sink for passive heat dissipation.

2. The measurement transducer as claimed in claim 1, wherein the heat sink is formed by the housing of the evaluation device.

3. The measurement transducer as claimed in claim 1, wherein an end of the heat pipe distal to the evaluation device and proximate to the sensor is embedded in the thermal insulating layer.

* * * * *